United States Patent
Brugger et al.

(10) Patent No.: US 9,559,682 B2
(45) Date of Patent: Jan. 31, 2017

(54) PROTECTED SWITCHING ELEMENT

(71) Applicant: Infineon Technologies AG, Neubiberg (DE)

(72) Inventors: Florian Brugger, Villach (AT); Robert Illing, Finkenstein (AT); Alexander Mayer, Treffen (AT); Christian Djelassi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 14/594,957

(22) Filed: Jan. 12, 2015

(65) Prior Publication Data
US 2016/0204776 A1 Jul. 14, 2016

(51) Int. Cl.
| G05F 1/10 | (2006.01) |
| G05F 3/02 | (2006.01) |
| H03K 17/082 | (2006.01) |
| H03K 17/20 | (2006.01) |
| H03K 17/24 | (2006.01) |
| H02H 3/00 | (2006.01) |

(52) U.S. Cl.
CPC ........... *H03K 17/0822* (2013.01); *H02H 3/00* (2013.01); *H03K 17/20* (2013.01); *H03K 17/24* (2013.01)

(58) Field of Classification Search
USPC .................. 327/108–112, 540–544
See application file for complete search history.

(56) References Cited

U.S. PATENT DOCUMENTS

| 4,280,153 A * | 7/1981 | Tin ............................ G11B 5/03 360/66 |
| 7,239,495 B2 * | 7/2007 | Mori .................. H03K 17/0822 361/93.1 |
| 7,417,473 B2 * | 8/2008 | Kawamoto .............. H03K 4/00 327/108 |
| 7,995,359 B2 * | 8/2011 | Djenguerian ..... H02M 3/33507 307/31 |
| 8,008,953 B1 * | 8/2011 | Brumett, Jr. .......... H03K 17/166 327/109 |
| 8,400,187 B2 * | 3/2013 | Yamazaki ........... H01L 27/1225 326/102 |
| 8,547,142 B2 * | 10/2013 | Nakahara ......... H03K 17/08122 327/108 |
| 8,841,960 B2 * | 9/2014 | Cho ......................... H03L 7/00 327/113 |
| 2002/0105767 A1 * | 8/2002 | Schuellein ........... H02H 7/1213 361/93.1 |
| 2002/0130710 A1 * | 9/2002 | Mahrla ................... G05F 1/575 327/540 |
| 2002/0133660 A1 * | 9/2002 | Yamada .............. G06F 13/4081 710/301 |
| 2003/0226054 A1 * | 12/2003 | Benno ...................... G06F 1/04 713/500 |
| 2006/0033650 A1 * | 2/2006 | Leung ............... H02M 3/33515 341/143 |
| 2007/0064364 A1 * | 3/2007 | Tuchihashi ........ H03K 17/0822 361/90 |
| 2007/0132438 A1 * | 6/2007 | Jang ........................ H02M 1/32 323/282 |

(Continued)

*Primary Examiner* — Adam Houston
(74) *Attorney, Agent, or Firm* — Shumaker & Sieffert, P.A.

(57) ABSTRACT

A circuit is suggested comprising an electronic switching element, a logic unit coupled to control the electronic switching element, and a counter unit coupled to the logic unit, wherein the counter unit comprises a counter and an internal power supply.

22 Claims, 2 Drawing Sheets

(56) References Cited

U.S. PATENT DOCUMENTS

| | | | |
|---|---|---|---|
| 2008/0048877 A1* | 2/2008 | Takahashi | H03K 17/0822 340/653 |
| 2008/0231352 A1* | 9/2008 | Kurd | H03L 7/107 327/544 |
| 2009/0135531 A1* | 5/2009 | Hirata | H02H 3/093 361/18 |
| 2011/0051296 A1* | 3/2011 | Ando | H03K 17/0822 361/18 |
| 2011/0110011 A1* | 5/2011 | Dittfeld | B60R 21/017 361/248 |
| 2012/0074989 A1* | 3/2012 | Mori | H03K 17/0822 327/110 |
| 2012/0182004 A1* | 7/2012 | Higuchi | H02P 29/0088 323/284 |
| 2012/0262132 A1* | 10/2012 | Park | H02M 1/4225 323/207 |
| 2013/0100719 A1* | 4/2013 | Tzeng | H02M 1/32 363/56.01 |
| 2014/0002179 A1* | 1/2014 | Ogawa | G11C 16/30 327/540 |
| 2014/0112036 A1* | 4/2014 | Chen | H02H 3/085 363/53 |
| 2014/0346966 A1* | 11/2014 | Wu | H05B 41/3924 315/201 |
| 2015/0002219 A1* | 1/2015 | Araki | H03K 17/962 327/543 |
| 2015/0123629 A1* | 5/2015 | Ohshima | H03K 17/0822 323/271 |
| 2015/0280702 A1* | 10/2015 | Walker | G01K 7/16 327/543 |
| 2015/0349776 A1* | 12/2015 | Abouda | H03K 19/017509 327/109 |
| 2016/0056818 A1* | 2/2016 | Kanda | H03K 17/6872 318/504 |

\* cited by examiner

PROTECTED SWITCHING ELEMENT

BACKGROUND OF THE INVENTION

Embodiments of the present invention relate to a protected switching element, in particular a protected field effect transistor PROFET and to a method operating such circuit or device.

SUMMARY

A first embodiment relates to a circuit comprising
an electronic switching element,
a logic unit coupled to control the electronic switching element,
a counter unit coupled to the logic unit, wherein the counter unit comprises a counter and an internal power supply.

A second embodiment relates to a device comprising at least one such circuit.

A third embodiment relates to a method for operating such circuit (or device), the method comprising:
determining an interruption in an external supply voltage,
based on such interruption, decoupling the external supply voltage from the counter unit such that the counter unit is buffered by the internal power supply.

A fourth embodiment is directed to a device comprising:
means for determining an interruption in an external supply voltage,
based on such interruption, means for decoupling the external supply voltage from a counter unit such that the counter unit is buffered by an internal power supply.

A fifth embodiment is directed to a computer program product directly loadable into a memory of a digital processing device, comprising software code portions for performing the steps of the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Figure 1:
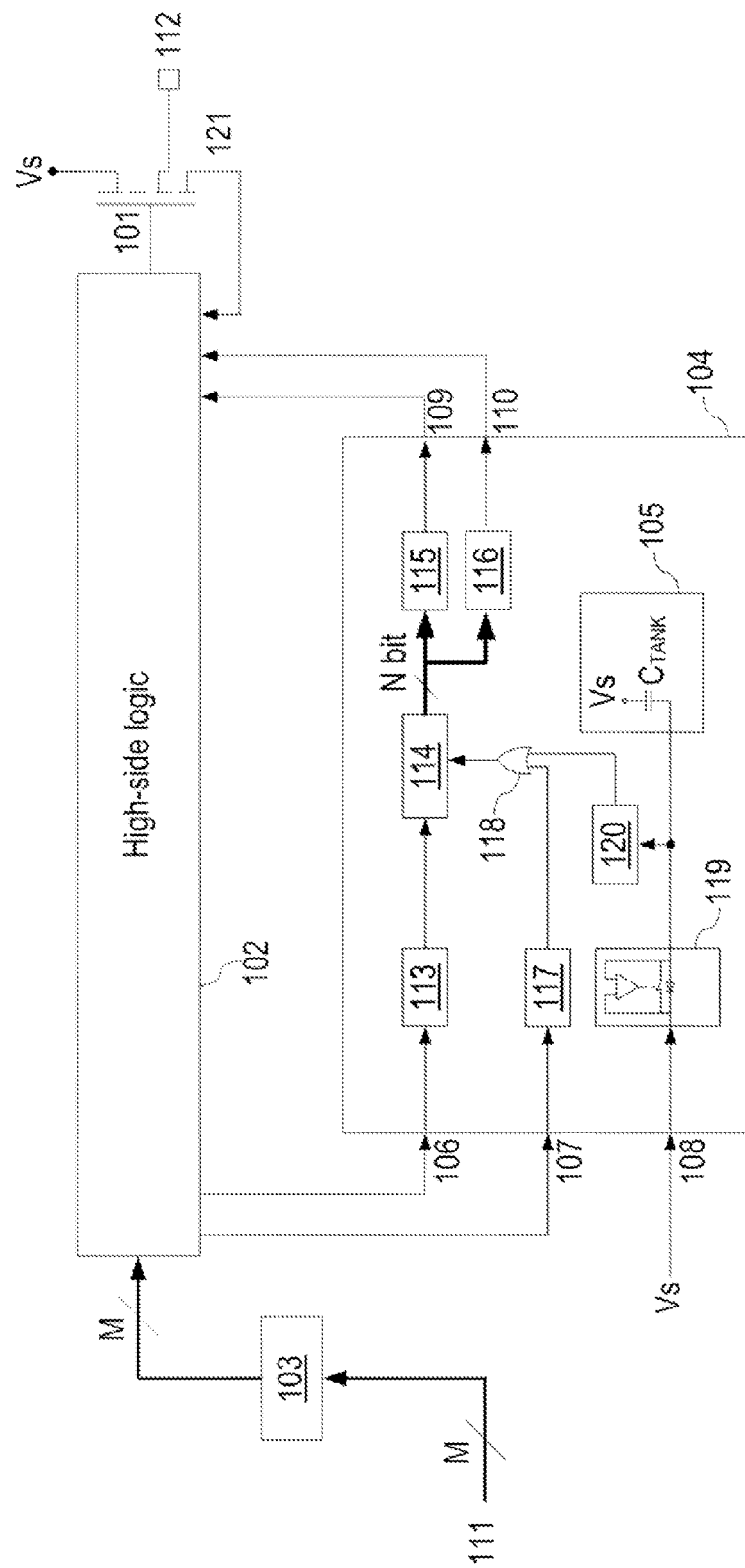
FIG. 1 shows a schematic diagram of a protected FET comprising a high-side switch, a high-side logic, a level shifter and a counter unit.

Modern automotive and industrial systems use smart power switches instead of fuses and electromechanical switches for low-voltage applications with medium to high current loads. Smart power products are intelligent power switches equipped with several diagnostic abilities and protection features, particularly against overload and short circuit events. They may use circuitry like pn-junctions for temperature sensing, shunt resistors and op-amps for current limitation as well as Zener diode clamping to protect against over-voltages. Due to cost and design optimizations, smart power devices are stressed up to their thermal and electrical limits.

A protected field effect transistor (FET) may be referred to as "PROFET". Such PROFET may provide a wide operating range, reverse polarity protection, improved EMC, safety, security and/or integrated diagnosis and protection features. Protection may in particular comprise overcurrent, over-temperature and temperature difference shut down. Depending on the protection strategy, the device (1) may be restarted automatically after each shut down operation (also referred to as "restart mode");
(2) may require an external reset to restart after a single shutdown (also referred to as "latched mode"); or
(3) may perform a specified number of retries before going into a failure state (referred to as "counted latched mode").

The options (2) and (3) may require a sort of latch and/or counter to become aware and/or memorize the actual state.

In case a power supply experiences an interruption, an energy supply for a logic of the PROFET also gets interrupted and a value of the latch indicating the recent state gets lost, e.g., by being reset when the power returns.

As a result, the PROFET may be unable to consider the previous value of the latch and it may restart without applying an external reset. In case the PROFET is in a continuous overload situation (based on, e.g., a short circuit at its output) and interruptions of the power supply may occur repeatedly the PROFET may thus suffer from such overload condition, which may reduce its lifetime and/or short circuit performance.

In case the PROFET shares its power supply with other switching devices, interruptions of the power supply may be based on fast load switching and/or the inductance of the supply lines. For automotive applications, different voltage transients are normed as so-called ISO pulses according to ISO 7637-2 ("Road vehicles—Electrical disturbances from conduction and coupling—Part 2: Electrical transient conduction along supply lines only). These indicate some scenarios that may lead to a fluctuation of the supply power thereby resulting in an unwanted loss of the counter value, which would otherwise be used to, e.g., enter the failure state (see "counter latched mode" as described above).

Examples provided herein in particular ensure that a state information (regarding, e.g., an undesired or error scenario) does not get lost due to, e.g., an ISO pulse or a fluctuation of the supply power. Furthermore, examples presented enable an energy- and cost-efficient solution that may in particular not require an externally buffered power supply.

According to an example, a counter unit may be provided together with or in the vicinity of a switching element, which may both be part of a device or circuit, which may be referred to as protected field effect transistor (PROFET). The counter unit may comprise at least one counter and/or latch unit. An internal supply (also referred to as internal power supply) may be provided for the counter unit to provide a buffering capability for short interruptions of the power supply. The internal supply may be arranged with the counter unit or adjacent to the counter unit. The internal supply may in particular be part of the PROFET.

The PROFET may comprise at least one electronic switching element, e.g., at least one transistor, in particular FET or a bipolar transistor, an IGBT or any other semiconductor circuitry. The PROFET may in particular be used as a high-side switch or as a low-side switch. Such high-side switch is directly or indirectly connected between a supply voltage and a load (in contrast to a low-side switch that is directly or indirectly connected between a load and ground).

Hence, the internal supply allows maintaining information about faulty conditions during power supply interruptions without any need of additional external circuitry.

As an option, additional information like a result of an analog-to-digital converter (ADC) or at least one status bits may be buffered by the internal supply. This may help to improve data integrity.

FIG. 1 shows a schematic diagram of a protected FET comprising a high-side switch 101, a high-side logic 102, a level shifter 103 and a counter unit 104. The high-side switch is a n-channel MOSFET with a gate, a drain and two sources.

An M-bit input signal 111 is conveyed to and processed by the level shifter 103 to an M-bit signal that is fed to the high-side logic 102. The input signal 111 may be a digital information regarding a dimming state of a lighting device, which can be supplied via a PWM signal 111 and it may then be converted into the digital domain of the high-side logic 102 by the level shifter 103.

The high-side logic 102 comprises a gate driver, which is connected to the gate of the high-side switch 101. Also, the high-side logic 102 comprises a diagnostics function. A first source of the high-side switch 101 is connected to an output pin 112, which may provide the output signal of the PROFET. A second source 121 of the high-side switch 101 is connected to the high-side logic 102 to allow sensing the current through the high-side switch 101. The second source 121 may be associated with an active area that is significantly smaller than an active area of the first source: Hence, a portion of the current supplied to the output pin 112 may be fed back to the high-side logic, said portion may be based on the ratio of the active areas and allows determining the actual current that is provided towards the output pin 112 via the first source.

The drain of the high-side switch 101 is connected to a supply voltage Vs.

The counter unit 104 comprises inputs 106, 107 and 108 and outputs 109 and 110. The high-side logic 102 may determine a thermal overload or an electrical overload condition, which is indicated towards the input 106 of the counter unit 104. The input 106 is connected to a preprocessing unit 113, which provides a count input to an N bit counter 114. The preprocessing unit 113 may comprise a filter, e.g., a spike filter, and a level shifter in order to determine the type of pulse that is subject to being counted by the N bit counter 114. Hence, the N bit counter 114 may be incremented by each event that corresponds to, e.g., an overload condition. The value of the N bit counter 114 may be used for further processing, e.g., to (temporarily) switch off (or switch on depending on a safe state condition) the PROFET (e.g., by not activating the switch 101 via its gate) after a predetermined number of overload conditions have occurred.

The high-side logic 102 may determine a condition for resetting the N bit counter 114. This may be indicated towards the input 107 (also referred to as "reset input"). The input 107 is connected to a preprocessing unit 117. The preprocessing unit 117 may comprise a filter, e.g., a spike filter, and a level shifter in order to determine an external reset request from the signal provided by the high-side logic 102 to the input 107. The output of the preprocessing unit 117 is connected to the first input of an OR gate 118.

The supply voltage, a floating ground (or a signal based on the floating ground) is conveyed to the input 108 of the counter unit 104. The input 108 is connected to a supply decoupling unit 119 and the supply decoupling unit 119 is further connected to a supply supervision unit 120 as well as to an internal supply 105. The output of the supply supervision unit 120 is connected to the second input of the OR gate 118.

The output of the OR gate 118 provides a "counter reset signal" to the N bit counter 114: Hence, the N bit counter 114 is reset in case any of the inputs of the OR gate 118 equals logic "1", which is the case if either the high-side logic 102 issues a reset to the input 107 or the supply supervision unit 120 indicates that a reset of the N bit counter 114 is appropriate (see below).

The output of the N bit counter 114 comprises an N bit counter value, which according to the example shown in FIG. 1 is fed to a comparator 115 and to a comparator 116.

The comparator 115 compares the N bit counter value with a predefined value. If this predefined value is reached (optionally: exceeded), a fault signal may be conveyed via the output 109 to the high-side logic 102. An exemplary use case may be as follows: If the N bit counter 114 reaches a maximum value, the output 112 will be disabled until the N bit counter 114 is reset.

The fault signal that is conveyed via the output 109 may be used to disable the high-side switch 101 by controlling its gate accordingly. The fault signal may also be processed by an application, e.g., a processing device, a controller, a microprocessor or the like. The fault signal may be conveyed to the outside via a pin.

The comparator 116 determines whether the N bit counter value is larger than 0. If this is not the case, a "counter is not zero" signal is conveyed via the output 110 to the high-side logic 102. As an alternative, a signal indicating that the counter equals zero may be conveyed towards the high-side logic 102.

According to an exemplary embodiment, the signal at the output 110 may be processed by an application, e.g., a processing device, a controller, a microprocessor or the like. Hence, this signal may be conveyed to the outside via a pin.

It is also an option that the N bit counter value is conveyed to the high-side logic 102 and/or any other processing device and the high-side logic 102 and/or said other processing device conduct(s) the comparing described with regard to the comparators 115 and 116.

The supply decoupling unit 119 compares the signal at the input 108 with the signal provided by the internal supply 105. If the voltage at the input 108 falls below a predetermined voltage threshold, a connection to the input 108 may be interrupted (e.g., by opening an electronic switch) and the energy stored in the internal supply 105 is used for buffering components of the counter unit 104.

The internal supply 105 may comprise a capacitor $C_{Tank}$ that is arranged between the output of the supply decoupling unit 119 and the supply voltage Vs. This capacitor $C_{Tank}$ may be dimensioned to supply the components of the counter unit 104 for a duration of, e.g., 20 μs, which may suffice to overcome ISO pulses or similar disturbances.

The supply supervision unit 120 monitors the voltage level provided by the capacitor $C_{Tank}$. For example, if the voltage decreases and reaches or falls short of a predefined first threshold, the supply supervision unit 120 may issue a reset towards the N bit counter 114. This may be applicable in case the charge stored in the capacitor $C_{Tank}$ does not suffice and/or in case the power supply is switched off for a period longer than what is intended to be buffered by the capacitor $C_{Tank}$.

According to a further example, if the voltage increases (e.g., after a power on) and reaches or exceeds a predetermined second threshold, the supply supervision unit 120 issues a reset signal as soon as it is powered up (e.g., in case the voltage at the supply supervision unit 120 shows a rising edge) and maintains this reset signal for a predetermined amount of time, e.g., 4 μs. Such time may suffice to initialize, i.e. reset, the N bit counter 114 after the power has been switched on. As soon as the predetermined amount of time has passed, the supply supervision unit 120 stops issuing the reset signal towards the N bit counter 114, which enables the N bit counter 114 to count the aforementioned overload conditions. This power on reset (POR) functionality ensures that the N bit counter 114 is in a defined state after the PROFET has been powered up.

Hence, examples presented allow counting and/or storing of conditions, e.g., fault events and/or other data like overcurrent or over-temperature conditions. In order not to lose information during an interruption of the supply voltage Vs, the internal supply 105 buffers the components of the counter unit 104 (or at least a portion of these components).

The internal supply 105 may become decoupled in case the voltage at the input 108 reaches and/or falls below the predetermined threshold, i.e. in case the device shown in FIG. 1 loses its supply voltage. In such case, the internal supply (e.g., via the capacitor $C_{Tank}$) provides power for the values of, e.g., registers such that they remain stored (for as long as the internal supply power lasts).

The supply decoupling unit 119 may be arranged such that it decouples the supply voltage floating ground from the input 108. Supplying the counter unit 104 may require only a small amount of energy, which may in particular be provided to the supply supervision unit 120. This allows using a buffer comprising the capacitor $C_{Tank}$ which may be in the range of a few picofarad.

As the supervision unit 120 may draw a (e.g., substantially constant) current from the internal supply 105, the storage time is limited after the power supply has been interrupted. Hence, an application may reset the PROFET by shutting it down in case the power stored in the internal supply 105 runs short. Such reset may be triggered via the input 107 by the high-side logic 102 or by any other processing unit.

Figure 2:
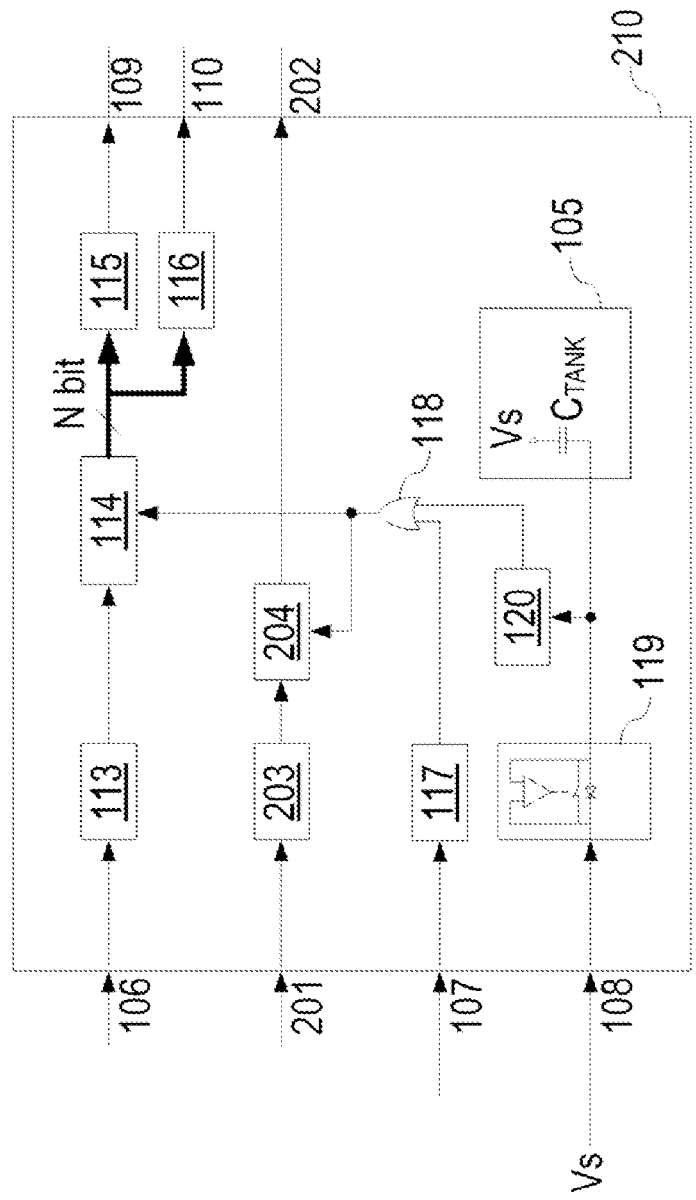
FIG. 2 shows another example of a counter unit based on the counter unit depicted in FIG. 1.

FIG. 2 shows another example of a counter unit 210 based on the counter unit 104 depicted in FIG. 1. In addition to the counter unit 104, the counter unit 210 comprises an input 201, an output 202, a preprocessing unit 203 and a storage element 204.

The preprocessing unit 203 may comprise a filter, e.g., a spike filter, and a level shifter in order to determine an signal to be stored in the storage element 204 based on a signal provided to the input 201. The output of the preprocessing unit 203 is connected to the output 202. A microcontroller, the high-side logic 102 or any other processing device may convey various signals, e.g., status signals, ADC-results, input signals, etc. to the input 201. The output 202 may be connected to such microcontroller, the high-side logic 102 or any other processing device for further processing purposes.

The output of the OR gate 118, which may convey a reset signal in case it is logic "1" may be connected to the storage element 204. In case the reset signal is logic "1", the storage element 204 is reset.

This allows using the power on reset, the power off reset and the external reset as described with regard to FIG. 1 above for the storage element 204. In addition, the storage element 204 may be supplied by the power of the internal supply 105 as well. The storage element 204 may comprise at least one register and it may in particular be a volatile random access memory (RAM).

Advantageously, the solution presented may be implemented in a power n-substrate technology, wherein the substrate may be tied to the positive supply potential. The internal logic supply may be high-side related (i.e. connected to the supply voltage), thus the common potential may be the voltage Vs and the logic ground may be set at a constant value below this voltage Vs.

The examples suggested herein may in particular be based on at least one of the following solutions. In particular combinations of the following features could be utilized in order to reach a desired result. The features of the method could be combined with any feature(s) of the device, apparatus or system or vice versa.

A circuit is suggested, said circuit comprising
an electronic switching element,
a logic unit coupled to control the electronic switching element,
a counter unit coupled to the logic unit, wherein the counter unit comprises a counter and an internal power supply.

The counter unit may be any component comprising a register, counter or memory that can be buffered by the internal power supply for some time.

The logic unit may be used to control the electronic switching element, e.g., a gate or base of a transistor. The logic unit may in particular comprise a driver for the electronic switching element and/or diagnostics functions.

According to an embodiment, the internal power supply is arranged to provide power to the counter unit in case an external supply voltage for the circuit gets interrupted.

The internal power supply may be dimensioned such that it may store energy to supply the counter unit for a predetermined amount of time. After that time a defined state of the counter unit may be triggered, e.g., a reset of the counter within the counter unit may be initiated. Such reset may be triggered by a falling edge of the voltage of the internal power supply: in case the internal power supply decreases, reaches or falls below a threshold, the counter is reset. This may be monitored and initiated by a supply supervision unit that may be part of the counter unit.

According to an embodiment, the electronic switching element comprises at least one transistor with a current sense unit, wherein the current sense unit is connected to the logic unit.

The switching element may be a bipolar transistor, an IGBT, a FET, a MOSFET or the like. The current sense unit may utilize a second source or a second emitter of the switching element. The current sense unit may allow determining a current conveyed by the transistor towards an external load.

According to an embodiment, the counter unit comprises a supply decoupling unit that is coupled to the internal power supply, wherein the supply decoupling unit is arranged
to determine an interruption in the external supply voltage and
based on such interruption to decouple the external supply voltage from the counter unit such that the counter unit is buffered by the internal power supply.

The external supply voltage can be any power supply that may be used to drive the circuit.

According to an embodiment, the supply decoupling unit and the internal power supply are coupled to a supply supervision unit, wherein the supply supervision unit is arranged to issue a signal to reset the counter.

According to an embodiment, the supply supervision unit is arranged to issue the signal to reset the counter in case the power provided by the internal power supply reaches and/or falls below a predetermined threshold.

According to an embodiment, the supply supervision unit is arranged to stop issuing the signal to reset the counter in case the external supply voltage has been switched on.

According to an embodiment, the supply supervision unit is arranged to stop issuing the signal to reset the counter a predetermined time after an enablement of the external supply voltage has been detected.

The enablement of the external supply voltage may also correspond to a rising edge (or any switching on) of the external power supply.

According to an embodiment, the counter unit comprises an input for resetting the counter.

The input may be controlled by the logic unit or an external processing device.

According to an embodiment, the counter of the counter unit is arranged for counting events, wherein signals corresponding to events are supplied by the logic unit.

According to an embodiment, the event may be at least one of the following:
an over-temperature condition,
a temperature difference excess,
an over-current condition,
an overload condition,
a fault condition,
any preferred signal or event.

According to an embodiment, the counter unit comprises a first comparing unit determining whether the counted events reach a predetermined threshold.

According to an embodiment, the counter unit comprises a second comparing unit determining whether the counted events is zero or different from zero.

The output of the first and/or second comparator may be conveyed to the logic unit or an external processing device. The first and/or second comparing unit may be a comparator. It is an option that the result of the first comparing unit and/or the second comparing unit may be supplied external to the circuit via a connection or pin.

According to an embodiment, the counter unit comprises a storage element for storing at least one information, wherein the internal power supply is arranged to provide power for buffering the at least one information in case an external supply voltage for the circuit gets interrupted.

Such storage element may, e.g., be a register, a memory device or a latch. The information stored in the storage element may be subject to buffering as is the counter of the counter unit. Also, the same reset mechanisms described for the counter of the counter unit may apply with regard to the information stored in the storage element.

According to an embodiment, the internal power supply comprises at least one capacitor that is charged via an external supply voltage.

The at least one capacitor may be dimensioned to buffer energy for the counter unit for a duration of, e.g., about 20 µs. The energy stored may in particular suffice to buffer short interruptions of the external supply voltage based on, e.g., ISO pulses.

According to an embodiment, the electronic switching element is implemented as a high-side switch or as a low-side switch.

The switching element may in particular be part of a switching device comprising a half-bridge or a full-bridge.

Also, a device is provided, said device comprising at least one circuit as described herein.

According to an embodiment, the device is a protected field effect transistor.

Further, a method is provided for operating a circuit as described herein; the method comprises:
determining an interruption in an external supply voltage, based on such interruption, decoupling the external supply voltage from the counter unit such that the counter unit is buffered by the internal power supply.

According to an embodiment, the method comprises:
counting events by the counter of the counter unit, wherein signals corresponding to events are supplied by the logic unit.

According to an embodiment, the method comprises:
issuing a signal to reset the counter in case the power provided by the internal power supply reaches and/or falls below a predetermined threshold.

According to an embodiment, the method comprises:
stop issuing the signal to reset the counter a predetermined time after an enablement of the external supply voltage has been detected.

Also, a device is provided, said device comprising:
means for determining an interruption in an external supply voltage,
based on such interruption, means for decoupling the external supply voltage from a counter unit such that the counter unit is buffered by an internal power supply.

In one or more examples, the functions described herein may be implemented at least partially in hardware, such as specific hardware components or a processor. More generally, the techniques may be implemented in hardware, processors, software, firmware, or any combination thereof If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media.

Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A circuit comprising
an electronic switching element,
a logic unit coupled to control the electronic switching element, and
a counter unit coupled to the logic unit, wherein the counter unit comprises a counter and an internal power supply, wherein the internal power supply is arranged to provide power to the counter unit in case an external supply voltage for the circuit gets interrupted.

2. The circuit according to claim 1, wherein the electronic switching element comprises at least one transistor with a current sense unit, wherein the current sense unit is connected to the logic unit.

3. The circuit according to claim 1, wherein the counter unit comprises a supply decoupling unit that is coupled to the internal power supply, wherein the supply decoupling unit is arranged to determine an interruption in the external supply voltage and
based on such interruption to decouple the external supply voltage from the counter unit such that the counter unit is buffered by the internal power supply.

4. The circuit according to claim 3, wherein the supply decoupling unit and the internal power supply are coupled to a supply supervision unit, wherein the supply supervision unit is arranged to issue a signal to reset the counter.

5. The circuit according to claim 4, wherein the supply supervision unit is arranged to issue the signal to reset the counter in case the power provided by the internal power supply reaches and/or falls below a predetermined threshold.

6. The circuit according to claim 4, wherein the supply supervision unit is arranged to stop issuing the signal to reset the counter in case the external supply voltage has been switched on.

7. The circuit according to claim 4, wherein the supply supervision unit is arranged to stop issuing the signal to reset the counter a predetermined time after an enablement of the external supply voltage has been detected.

8. The circuit according to claim 1, wherein the counter unit comprises an input for resetting the counter.

9. The circuit according to claim 1, wherein the counter of the counter unit is arranged for counting events, wherein signals corresponding to events are supplied by the logic unit.

10. The circuit according to claim 9, wherein the event may be at least one of the following:
an over-temperature condition,
a temperature difference excess,
an over-current condition,
an overload condition,
a fault condition,
any preferred signal or event.

11. The circuit according to claim 9, wherein the counter unit comprises a first comparing unit determining whether the counted events reach a predetermined threshold.

12. The circuit according to claim 9, wherein the counter unit comprises a second comparing unit determining whether the counted events is zero or different from zero.

13. The circuit according to claim 1, wherein the counter unit comprises a storage element for storing at least one information, wherein the internal power supply is arranged to provide power for buffering the at least one information in case an external supply voltage for the circuit gets interrupted.

14. The circuit according to claim 1, wherein the internal power supply comprises at least one capacitor that is charged via an external supply voltage.

15. The circuit according to claim 1, wherein the electronic switching element is implemented as a high-side switch or as a low-side switch.

16. A device comprising at least one circuit that includes:
an electronic switching element,
a logic unit coupled to control the electronic switching element,
a counter unit coupled to the logic unit, wherein the counter unit comprises a counter and an internal power supply, wherein the internal power supply is arranged to provide power to the counter unit in case an external supply voltage for the circuit gets interrupted.

17. The device according to claim 16, wherein the device is a protected field effect transistor.

18. A method for operating a circuit that comprises:
an electronic switching element,
a logic unit coupled to control the electronic switching element,
a counter unit coupled to the logic unit, wherein the counter unit comprises a counter and an internal power supply, wherein the internal power supply is arranged to provide power to the counter unit in case an external supply voltage for the circuit gets interrupted, the method comprising:
determining an interruption in the external supply voltage,
based on such interruption, decoupling the external supply voltage from the counter unit such that the counter unit is buffered by the internal power supply.

19. The method according to claim 18 comprising:
counting events by the counter of the counter unit, wherein signals corresponding to events are supplied by the logic unit.

20. The method according to claim 18 comprising:
issuing a signal to reset the counter in case the power provided by the internal power supply reaches and/or falls below a predetermined threshold.

21. The method according to claim 18 comprising:
stop issuing the signal to reset the counter a predetermined time after an enablement of the external supply voltage has been detected.

22. A device comprising:
means for determining an interruption in an external supply voltage,
based on such interruption, means for decoupling the external supply voltage from a counter unit such that the counter unit is buffered by an internal power supply.

* * * * *